United States Patent [19]

Matsumoto

[11] Patent Number: 5,745,374
[45] Date of Patent: Apr. 28, 1998

[54] LAYOUT METHOD FOR SEMICONDUCTOR INTEGRATED CIRCUIT AND LAYOUT APPARATUS FOR SEMICONDUCTOR INTEGRATED CIRCUIT

[75] Inventor: Nobu Matsumoto, Kanagawa-ken, Japan

[73] Assignee: Kabushiki Kaisha Toshiba, Kawasaki, Japan

[21] Appl. No.: 505,735

[22] Filed: Jul. 21, 1995

[30] Foreign Application Priority Data

Jul. 22, 1994 [JP] Japan ................................ 6-171012

[51] Int. Cl.$^6$ .............................. H01L 21/60; H01L 21/74
[52] U.S. Cl. ........................................................ 364/491
[58] Field of Search ................................ 364/488, 489, 364/490, 491, 578; 430/5; 395/500

[56] References Cited

U.S. PATENT DOCUMENTS

| 5,018,074 | 5/1991 | Griffith et al. | 364/490 |
|---|---|---|---|
| 5,369,596 | 11/1994 | Tokumaru | 364/491 |
| 5,388,054 | 2/1995 | Tokumaru | 364/490 |
| 5,535,134 | 7/1996 | Cohn et al. | 364/491 |
| 5,541,025 | 7/1996 | Oi et al. | 430/5 |

OTHER PUBLICATIONS

J. Dao, et al., "A compaction Method for Full Chip VLSI Layouts", Proc. 30th Design Automation Conference, Jan. 1993, pp. 407–412.

"An Algorithm to Compact a VLSI Symbolic Layout with Mixed Constraints"; Yuh-Zen Liao, and C.K. Wong; *IEEE Transactions on Computer-Aided Design of Integrated Circuits and Systems*; Apr. 1983, pp. 62–69.

"Improved Compaction by Minimized Length of Wire"; W. L. Schiele; *Proceedings of the 20th Design Automation Conference*; Munich, Germany; pp. 121–127, Jan. 1983.

"Kahlua: A Hierarchical Circuit Disassembler"; Bill Lin, and A. Richard Newton; *24th ACM/IEEE Design Automation Conference*; Jun. 1987, pp. 311–317.

*Primary Examiner*—Jacques H. Louis-Jacques
*Assistant Examiner*—Dan Fiul
*Attorney, Agent, or Firm*—Foley & Lardner

[57] ABSTRACT

There is disclosed a layout method for a semiconductor integrated circuit for use in design by a symbolic layout which expresses a configuration of the semiconductor integrated circuit by symbols. The layout method comprises the steps of extracting a mask layout to be processed, changing dimensions of a symbolic layout included in the mask layout, replacing transistor symbols included in the mask layout with symbols having diffusion layer terminals each having a constant length in the channel width direction and not having extent in the channel length direction, shortening a length of wiring included in the mask layout in the channel width direction of the transistor, and compacting the mask layout in the channel length direction of the transistor.

11 Claims, 9 Drawing Sheets

1

LAYOUT METHOD FOR SEMICONDUCTOR INTEGRATED CIRCUIT AND LAYOUT APPARATUS FOR SEMICONDUCTOR INTEGRATED CIRCUIT

BACKGROUND OF THE INVENTION

1. Field of the Invention

The present invention relates to a symbolic expression approach for a semiconductor integrated circuit layout (symbolic layout) and, more particularly, to a layout method for a semiconductor integrated circuit employing the symbolic expression approach in case diffusion resistance can be neglected like salicide technology and a layout apparatus for embodying the same.

2. Description of the Prior Art

The symbolic layout denotes that a layout of the semiconductor integrated circuit is expressed by symbols. In FIG. 1, a popular symbolic layout is shown. As such symbols, there are transistor symbols 13a, 15a, contact symbols 17a–23a and the like. These symbols are connected by wirings 25–41, 45, 47 (as a general term, these wirings are referred to as a wiring group hereinafter).

If proper widths are allotted to respective wirings of the wiring group and also distances between such symbols are shortened to respective minimum distances by means of compaction only in one dimension (one dimensional compactor) as far as the design rule allows such compaction (FIG. 2), an actual mask layout can be automatically generated (FIG. 3).

There are a plenty of references regarding this one dimensional compactor (For instance, Liao, Y. J. and Wong, C. K.: "An Algorithm to Compact a VLSI Symbolic Layout with Mixed Constraints", IEEE Transactions on Computer-Aided Design of Circuits and Systems, January 1984, pp.87–100).

However, if only such one dimensional compactor set forth in the above reference is used, there are some cases wherein lengths of part of the wirings are expanded unduly (FIG. 4) This is because, in case the compaction is made in the X-axis direction (horizontal direction in FIG. 4), a contact 43 is put to the left side as shown in FIG. 4 since figures are usually shifted to the left side for convenience sake insofar as such shift could be allowed by the design rule. As a result, a polysilicon wiring 47 is extended, so that a delay in the wiring 47 is increased. The increase of the delay in the wiring causes degraded circuit performance.

Therefore, in order to prevent degradation of the circuit performance, there has been disclosed an approach that a shortening process of the wirings is executed, as shown in FIG. 5, after the one dimensional compaction is made (For instance, Schiele, W. L.: "Improved Compaction by Minimized length of Wires", Proceedings of the 20th Design Automation Conference, June, pp.121–127).

Next, conventional instances of the symbolic layout related to the present invention will be explained in detail.

First, a first conventional instance is shown in FIG. 1 This first conventional instance is featured in that point-like transistor terminals 51 and point-like contact terminals 49 are used. Ordinarily, each of these symbols have a point symmetric shape, and the point-like terminals are located at the center points of respective shapes. In the case of the transistor symbol, one point-like polysilicon layer terminal and two point-like diffusion layer terminals (source terminal and drain terminal) are positioned at the center point of the transistor symbol (In FIG. 1, these are shown overlappedly). In addition, in the case of the contact symbol, one point-like diffusion layer terminal and one point-like Al1 layer terminal (point-like contact terminal 49) are positioned at the center point of the contact symbol. In the point-like terminals, center lines of the wiring group to be connected to these point-like terminals must pass through (or must reach) such terminal points. The above feature is not varied after compaction (i.e., the center lines pass through the terminal points). This first conventional instance is the most popular symbolic layout in the art.

FIG. 6 shows a second conventional instance of the symbolic layout relating to the present invention. A feature of the second conventional instance is that each of the transistor symbol 13b and the contact symbols 17b, 19b comprises respectively an element having a rectangular shape.

The transistor symbol 13b has two rectangular polysilicon layer terminals formed in a margin region for a polysilicon SDG (active region used for forming source, drain and gate regions), and two rectangular diffusion layer terminals 57 (source terminal and drain terminal) formed in a margin region for a diffusion layer SDG. In addition, the contact symbols 17b, 19b are so formed that each of the rectangular terminals 57 of the transistor symbol 13b is connected correspondingly to the diffusion regions of the contact symbols 17a, 19a and that one rectangular Al1 layer terminal is formed in the Al1 layer region of the contact symbols 17a, 19a.

Note that, in the case of these rectangular terminals, the center lines of the wirings connected to the rectangular terminals may pass through (or may reach) any location of the region of the rectangular terminals (FIG. 6). Ordinarily, as shown in FIG. 7, location relationship between the symbols are rearranged after the compaction. In the second conventional instance, as shown in FIG. 6, such advantage can be achieved that the user can draw wirings etc. relatively freely (but it is not required for the user to draw center points of the symbols precisely). However, the second conventional instance is not used so much since it has drawbacks described later.

In turn, the conventional process migration relating to the present invention will be explained. In the layout method for the semiconductor integrated circuit, such process migration has already been well known in the art that various processes such as scaling process, layer calculation process, compaction process etc. are conducted to a mask layout which is generated based on a certain design rule, and then the mask layout is modified into another mask layout which is generated based on another design rule to conduct other processes. Two ways have been well known as such process migration and are discussed hereinbelow.

In a primitive scaling approach as a first way, an existing mask layout is first reduced simply. Then, a new mask layout can be derived by either expanding or compacting respective reduced layers.

In a symbolic layout approach employing a symbolic compactor as a second way, first a symbolic layout is extracted from an existing mask layout (if, for example, the layout of FIG. 3 is assumed as the existing layout, the symbolic layout shown in FIG. 2 can be extracted from the layout of FIG. 3). Then, symbols in the extracted symbolic layout are subjected to the above primitive scaling so as to compact distances between the symbols by means of the symbolic compactor.

The second way has been disclosed in, for example, Lin. B. and Newton, A. R.: "KAHLUA: A Hierarchical Circuit Disassembler", 24th Design Automation Conference, June 1987, pp.311–317, and patent application publication (KOKAI) 63-159980.

However, in the second conventional symbolic layout, the most serious drawback is that, when effecting the compaction process, vast computer resources are needed. In general, the symbolic layout is expressed by the graph in the compactor. But, in contrast to the first conventional instance, one node and two branches of the graph are needed excessively at every terminal in the second conventional instance. Therefore, the same symbolic layout requires a plenty of main memories and process times in the second conventional instance. In particular, since the process migration demands large scale processing, the symbolic layout in the second conventional instance (FIG. 6) is not ordinarily practical.

In addition, if the salicide technology is employed in the first conventional symbolic layout, diffusion resistance can be decreased. Therefore, even if the diffusion layer-Al1 layer contacts are formed like a small size contact 17 shown in FIG. 8, instead of forming large size contacts like the contact 17a (i.e., which is formed in full transistor width) etc. shown in FIG. 1, degradation of performance seldom occurs. Consequently, after the symbolic layout (FIG. 2) is extracted from the existing mask layout (FIG. 3), it can be modified as shown in FIG. 8. FIG. 9 shows the result that the symbolic layout in FIG. 8 has been compacted. In this case, although contacts 19 and 21 are arranged right and left on the input side, an area of the entire layout cannot be reduced since, in one dimensional compaction, the size in the X-axis direction (horizontal direction in FIG. 9) cannot be changed, as shown in FIG. 9.

Similarly, if the salicide technology is employed in the conventional process migration, an area of the entire layout cannot be reduced effectively although the size of the contacts can be reduced. As a result, there has been a drawback that production cost cannot be decreased.

SUMMARY OF THE INVENTION

The present invention has been made to overcome conventional drawbacks, and its object is to provide a layout method for a semiconductor integrated circuit capable of applying process migration to such technology obtaining low diffusion layer resistance as salicide technology, especially achieving a size reduction of a layout after process migration, to thus reduce production cost, and a layout apparatus for embodying the same.

The present invention has been made to overcome above conventional drawbacks, and an object of the present invention is to provide an improvement in a layout method for a semiconductor integrated circuit capable of executing circuit design by symbolic layout which expresses a configuration of the semiconductor integrated circuit by symbols.

Another object of the present invention is to provide a layout method for a semiconductor integrated circuit capable of reducing production cost.

Still another object of the present invention is to provide a layout method for a semiconductor integrated circuit capable of decreasing a layout size effectively.

Still another object of the present invention is to provide a layout method for a semiconductor integrated circuit wherein vast computer resources are required upon compaction process.

In order to achieve the above objects, according to an aspect of the present invention, a layout method for a semiconductor integrated circuit designs by using a symbolic layout which expresses a configuration of said semiconductor integrated circuit by symbols, and said symbols comprises transistor symbols each having a diffusion layer terminal which has a constant length in the channel width direction and does not have extent in the channel length direction, contact symbols each having a point-like diffusion layer terminal, diffusion layer wiring symbols for connecting said diffusion layer terminal in said transistor symbol to said diffusion layer terminal in said contact symbol by a straight line, and metal wiring symbols for connecting said contact symbols.

According to another aspect of the present invention, a layout method for a semiconductor integrated circuit comprises the steps of extracting a mask layout to be processed, changing dimensions of a symbolic layout included in said mask layout, replacing transistor symbols included in said mask layout with symbols having diffusion layer terminals each having a constant length in the channel width direction and not having extent in the channel length direction, shortening a length of wiring included in said mask layout in the channel width direction of said transistor, and compacting said mask layout in the channel length direction of said transistor. In said step of changing dimensions of said symbolic layout, dimension of a contact symbol is compacted, and a width of diffusion layer wiring is narrowed correspondingly thereto.

In a preferred embodiment, a length of wiring included in said mask layout is shortened in the channel length direction of said transistor after said mask layout is compacted in the channel length direction of said transistor.

In addition, preferably, after this, said mask layout is compacted in the channel width direction of said transistor.

In addition, preferably, after this, a length of wiring included in said mask layout is narrowed in the channel width direction of said transistor.

In addition, preferably, after this, notches which do not satisfy a design rule are removed by a filling process and symbols are developing hierarchically.

According to still another aspect of the present invention, a layout apparatus for a semiconductor integrated circuit comprises a layout input unit for inputting a symbolic layout, a layout modification unit for modifying said symbolic layout input by said layout input unit, and a layout output unit for outputting said symbolic layout modified by said layout modification unit. And said layout modification unit includes contact size changing means for changing contact size of contact symbols, wiring width narrowing means for narrowing wiring width of diffusion layers, transistor symbol replacing means for replacing transistor symbols having point-like diffusion layer terminals with transistor symbols having diffusion layer terminals having constant lengths in the channel width direction and not having extent in the channel length direction, and wiring length shortening means for moving said contact symbols so as to shorten said wiring length.

Preferably, the layout apparatus for a semiconductor integrated circuit of the present invention further comprises a judgement unit for determining whether said layout is modified by said input symbolic layout or not, and said layout modification unit modifies said symbolic layout if said judgement unit determines that said layout should be modified.

In addition, preferably, said judgement unit determines that said layout should be modified if said symbolic layout has two transistor symbols positioned adjacent to each other in the channel length direction, two contact symbols arranged between said two transistor symbols, and wiring symbols extending therefrom in the opposite direction.

DESCRIPTION OF THE PREFERRED EMBODIMENTS

There will now be described preferred embodiments of the present invention hereinafter with reference to the accompanying drawings. In following descriptions, it is assumed that the channel length direction of transistor (lateral direction in figures) is the X-axis direction, and the channel width direction of transistor (vertical direction in figures) is the Y-axis direction.

First, a transistor symbol used in a layout method and a layout apparatus for a semiconductor integrated circuit according to the present invention will be explained. In particular, an original transistor symbol is used in the present invention, so that various advantages which are not obtained in the prior art can be brought about.

Figure 11A:
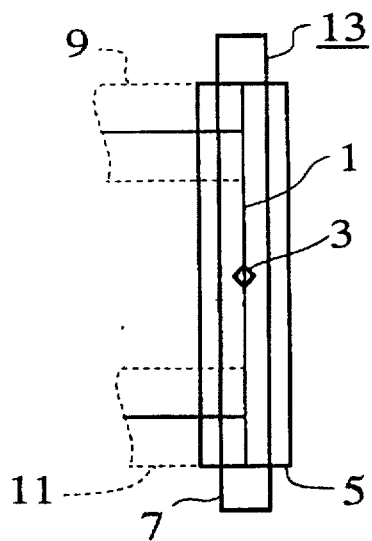
FIGS. 11A and 11B are views respectively showing a first instance and a second instance of transistor symbols used in a symbolic layout according to the present invention.

A transistor symbol 13 shown in FIG. 11A comprises a point-like polysilicon layer terminal 3 positioned in the center portion, a diffusion layer terminal 1 positioned in contact with the point-like polysilicon layer terminal 3, a diffusion layer 5 positioned along the X-axis direction (channel length direction) of the transistor symbol 13, and a polysilicon layer 7 positioned along the Y-axis direction (channel width direction) of the transistor symbol 13. Here, the diffusion layer terminal 1 has a certain length in the channel width direction, but does not have extent in the channel length direction. As a result, if a wiring is connected to the diffusion layer terminal 1, the wiring may be connected to any part of the diffusion layer terminal 1 from its upper end, like a wiring 9, to its lower end, like a wiring 11. However, degree of freedom exists only in the Y-axis direction. Thus, the wiring cannot be moved in the X-axis direction of the diffusion layer terminal 1.

Figure 11B:
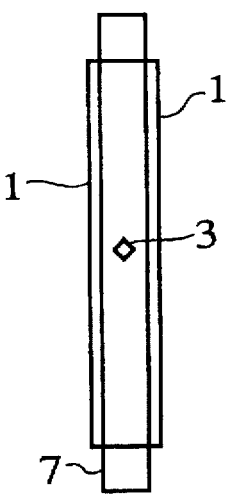

FIG. 11B shows another instance of the transistor symbol. In this transistor symbol, the diffusion layer terminals 1 are provided on both sides of the transistor symbol 13.

Figure 12:
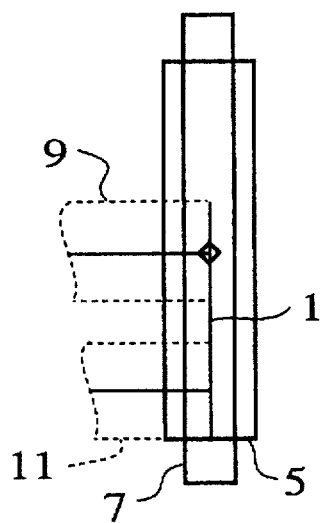
FIG. 12 is a view showing a third instance of the transistor symbol used in the symbolic layout according to the present invention.

FIG. 12 shows still another instance of the transistor symbol which is substantially identical to the transistor symbol shown in FIG. 11B, except that the diffusion layer terminal 1 does not spread over the entire channel width. By forming the diffusion layer terminal 1 as above, a movable range of the contact symbol can be limited intentionally.

Subsequently, with reference to FIG. 13, an embodiment of a symbolic layout of the present invention using the above symbols will be explained. This symbolic layout is composed of transistor symbols 13, 15 each having the diffusion layer terminal which has a certain length in the channel width direction but does not have extent in the channel length direction, as discussed above, contact symbols 17, 19, 21, 23 each having the point-like terminal, and diffusion layer wirings 25–31 for connecting aforementioned diffusion layer terminals by straight lines.

In turn, a power source line 41 formed of Al1 layer is connected only to the contact symbol 21. An Al1 layer wiring 37 extends downwardly from the source contact 21 of the transistor 15 to the power source line 41. Other Al1 layer wirings 33, 35, 39 connected to the diffusion contacts extend in the opposite direction to that of the power source line 41.

Next, an embodiment of process migration according to the present invention using the symbolic layout will be explained with reference to figures.

Figure 17:
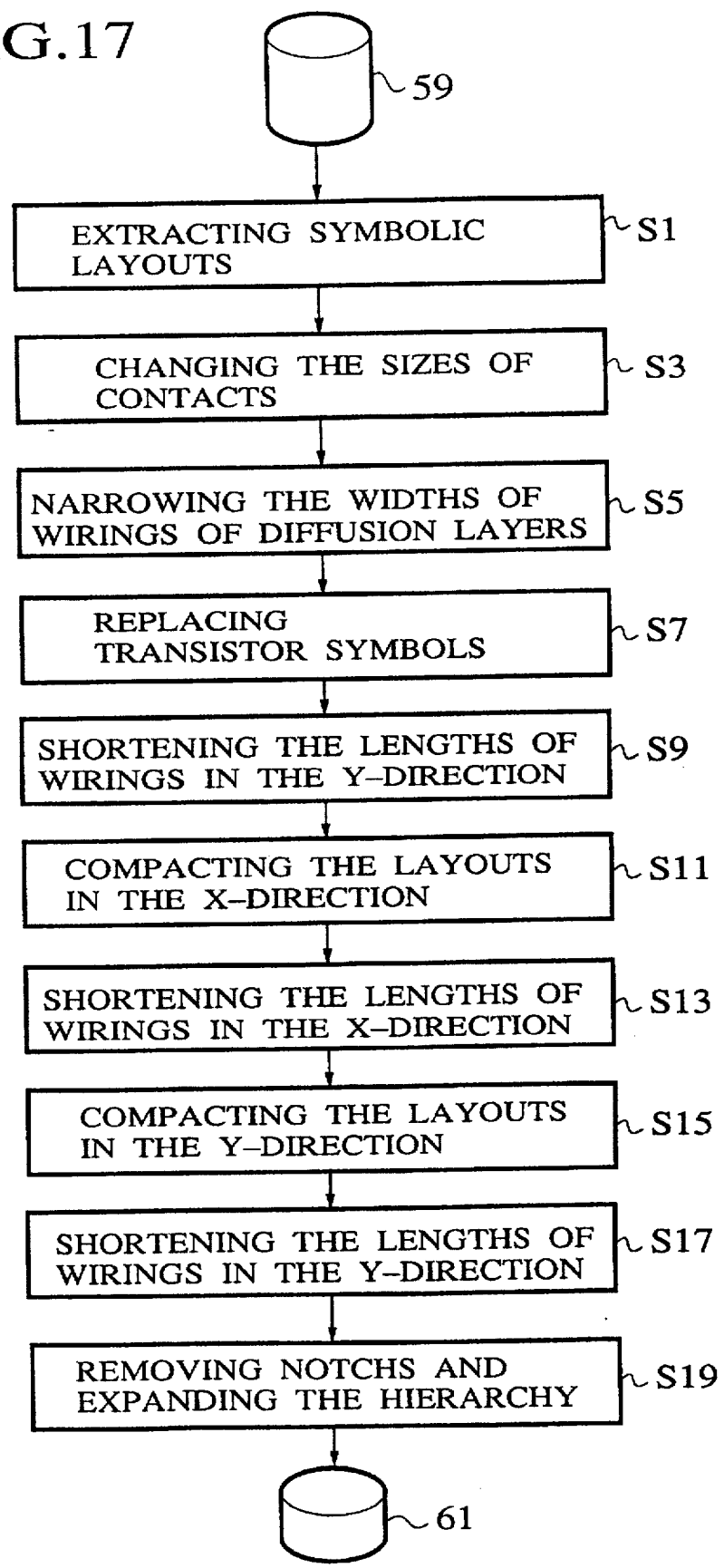
FIG. 17 is a flow chart showing process migration according to the present invention.

FIG. 17 is a flow chart showing process migration according to the present invention. According to this process migration, the first mask layout for the semiconductor integrated circuit which is obtained based on the first design rule can be modified into the second mask layout which is obtained based on the second design rule which is different from the first design rule (i.e., a dimension is compacted in the second design rule).

First, the symbolic layout to be processed (FIG. 2) is extracted from the existing mask layout 59 shown in FIG. 17 (S1 in FIG. 17).

Figure 1:
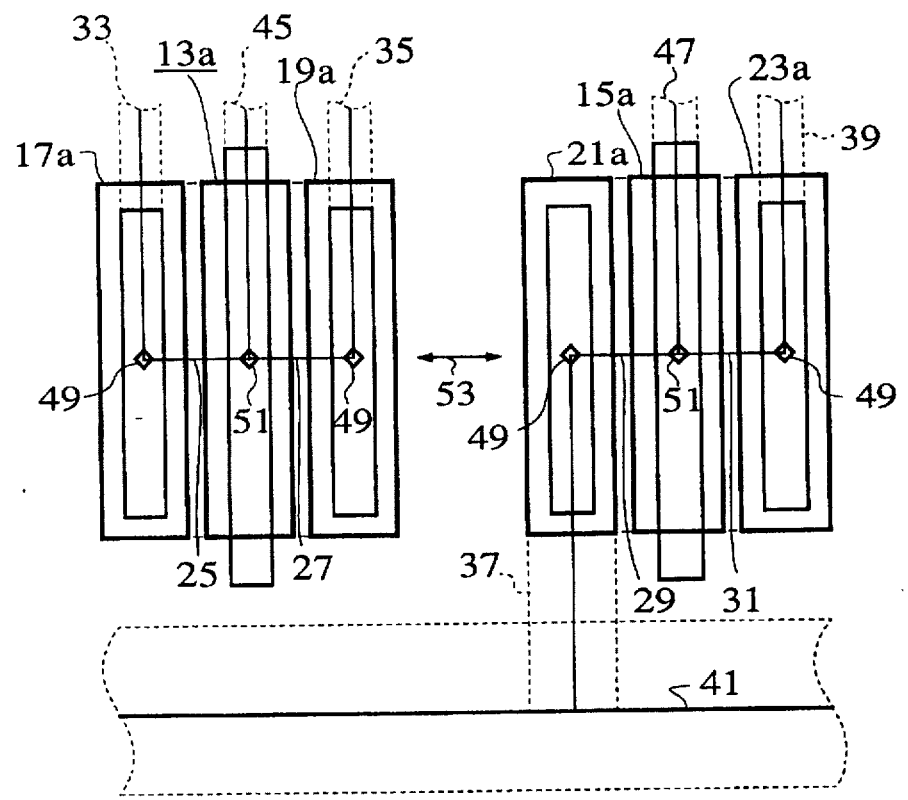
FIG. 1 is a view showing a first instance of a conventional symbolic layout.
Figure 2:
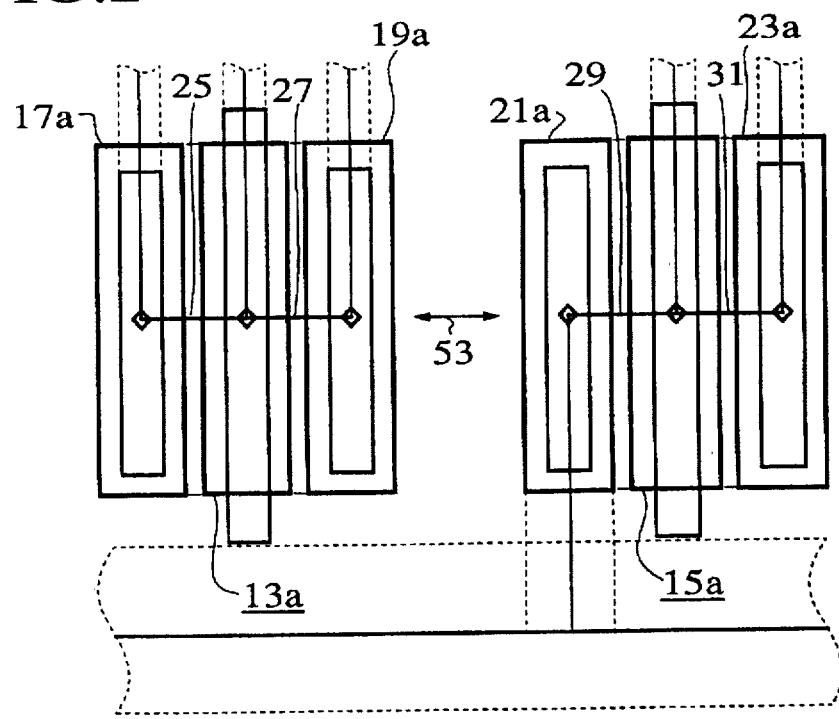
FIG. 2 is a view showing a resultant symbolic layout after the conventional symbolic layout shown in FIG. 1 is compacted.
Figure 3:
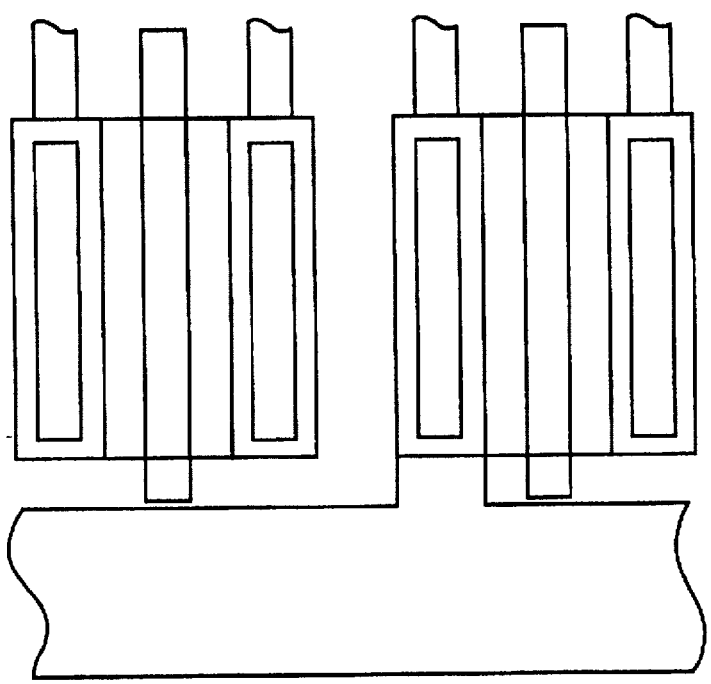
FIG. 3 is a view showing a mask layout formed by changing the conventional symbolic layout shown in FIG. 2 into a polygon.
Figure 4:
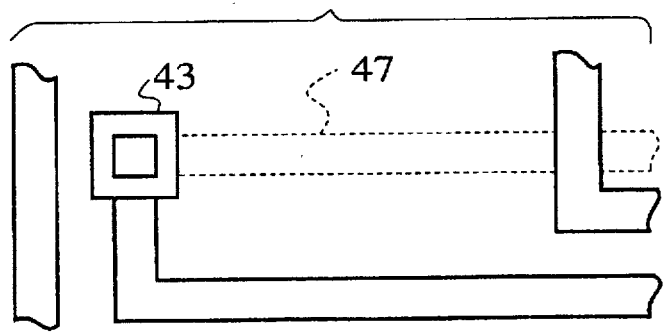
FIG. 4 is a view showing a resultant mask layout without a wiring length shortening function.
Figure 5:
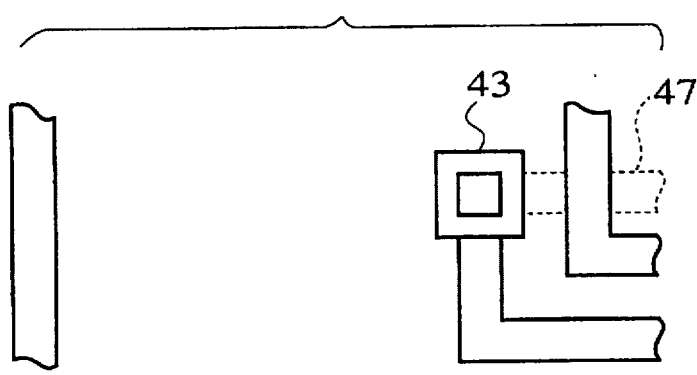
FIG. 5 is a view showing a resultant mask layout with a wiring length shortening function.
Figure 6:
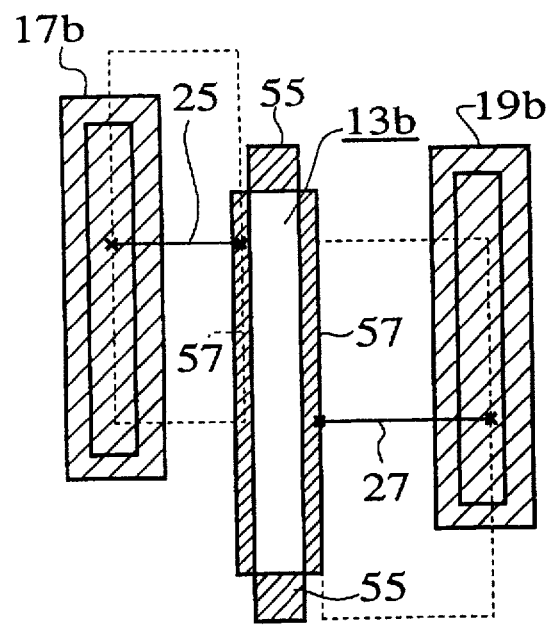
FIG. 6 is a view showing a second instance of a conventional symbolic layout.
Figure 7:
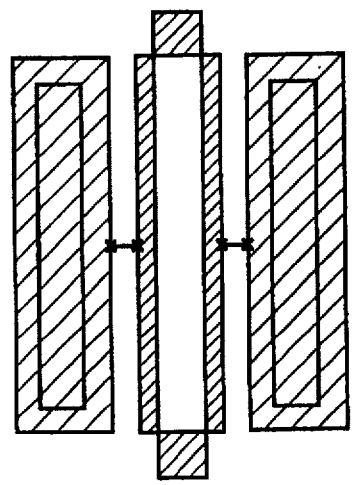
FIG. 7 is a view showing a resultant symbolic layout after the conventional symbolic layout shown in FIG. 6 is compacted.
Figure 8:
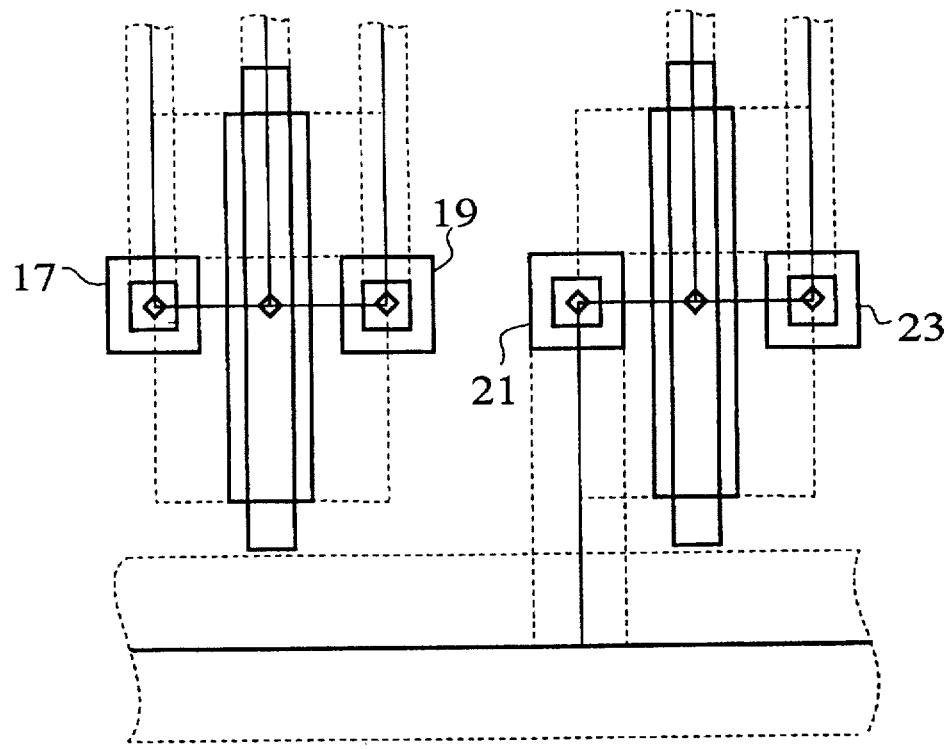
FIG. 8 is a view showing compacted diffusion contacts in the symbolic layout shown in FIG. 3.

Then, without changing models of the contact symbols 17a, 19a, 21a, 23a of the symbolic layout in FIG. 2, dimensions of the contact symbols are changed into respective minimum dimensions which are allowed by the design rule (S3 in FIG. 17). In addition, widths of the diffusion layer wirings 25, 31 in FIG. 2 are fitted to coincide with changed dimension of the diffusion layer of the contact (minimum dimension of the diffusion layer+diffusion margin of the contact!_2)(S5 in FIG. 17). In addition, the transistor symbols 13a, 15a in FIG. 2 are replaced with the symbols shown in FIG. 11A (S7 in FIG. 17).

Figure 13:
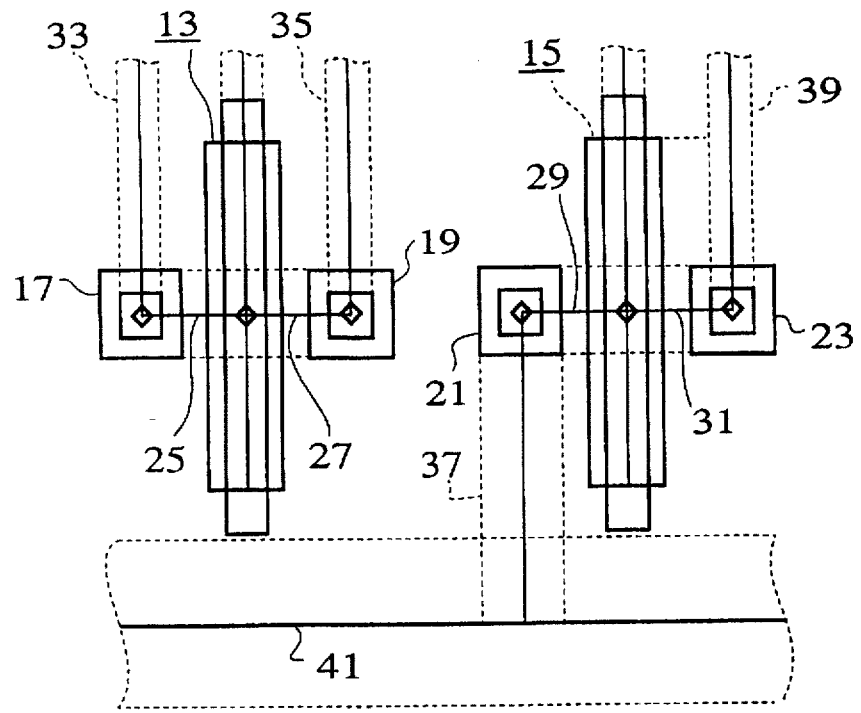
FIG. 13 is a view showing an embodiment of a symbolic layout according to the present invention.

Then, according to steps of S3, S5 and S7 in FIG. 17, a resultant symbolic layout is modified into a symbolic layout having the configuration of the present invention as shown in FIG. 13.

Figure 14:
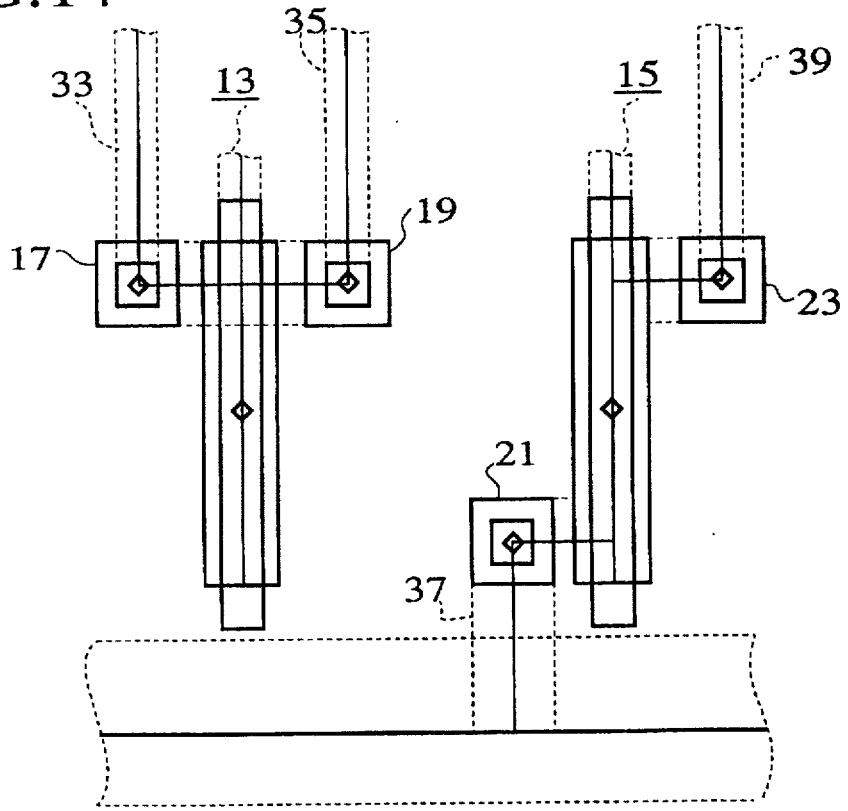
FIG. 14 is a view showing a resultant symbolic layout after a wiring length shortening process is made to the symbolic layout shown in FIG. 13.
Figure 15:
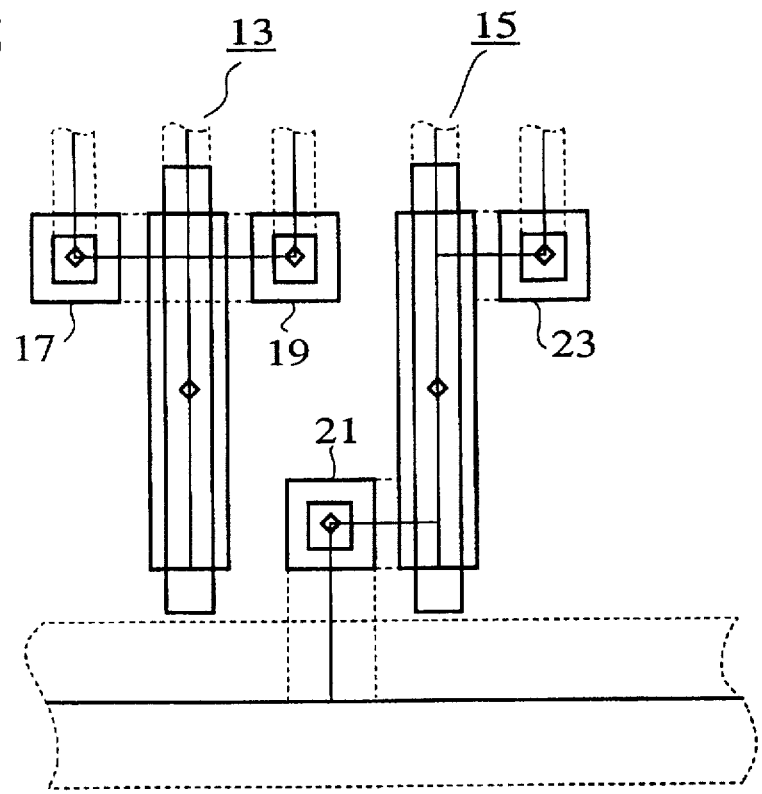
FIG. 15 is a view showing a resultant symbolic layout after the symbolic layout shown in FIG. 14 is compacted in the X-axis direction.

Subsequently, a wiring length shortening process is performed to the symbolic layout in FIG. 13 in the Y-axis direction (S9 in FIG. 17), thus resulting in a symbolic layout shown in FIG. 14. As the result of the wiring length shortening of the wirings 33, 35 and 39, the contacts 17, 19, 23 are moved upwardly whereas, as the result of the wiring length shortening of the wiring 37, the contact 21 is moved downwardly. In general, the source contact is moved toward the power source line, and other contacts are moved in the opposite direction. In case the diffusion contacts are positioned adjacent to the source contact 21, these contacts are formed ordinarily as contacts excluding the source contacts of other transistors (in other words, in case the source contacts must be formed adjacently, these source contacts are united to form a common source contact). Therefore, these contacts are moved in the opposite direction. As a result, clearances are generated respectively on the left of the source contact 21 and on the right of the other contact 19. These clearances are compacted by the compaction in the X-axis direction (S11 in FIG. 17), so that a symbolic layout compacted in the X-axis direction can be generated, as shown in FIG. 15.

The wiring length shortening in the X-axis direction (S13 in FIG. 17) and the compaction of layout in the Y-axis direction (S15 in FIG. 17) are also applied to a symbolic layout which is rotated by 90 degree (i.e., in this case, the channel length direction of the transistor is set as the Y-axis direction) to effect similar compaction of size. The wiring length shortening in the Y-axis direction (S17 in FIG. 17) is made to prevent degradation in performance due to the extension of the wiring in the Y-axis direction.

Figure 9:
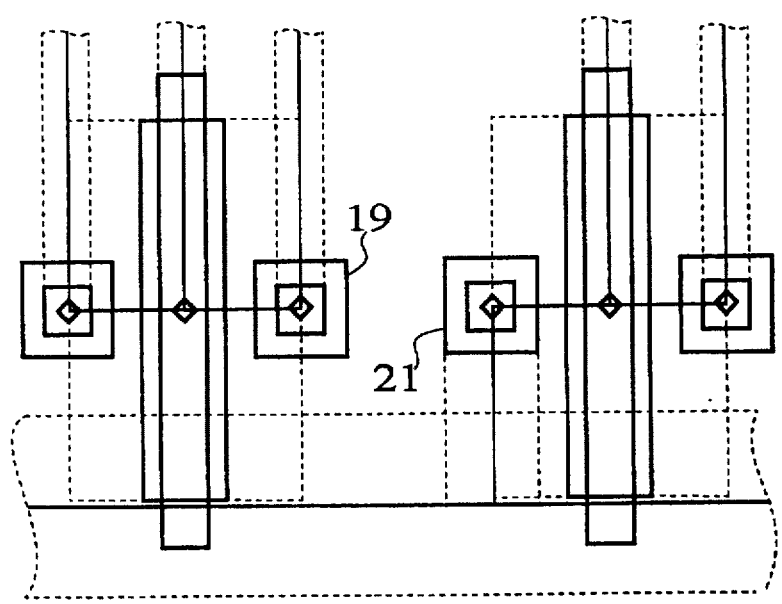
FIG. 9 is a view showing a resultant symbolic layout after the conventional symbolic layout shown in FIG. 8 is compacted.
Figure 16:
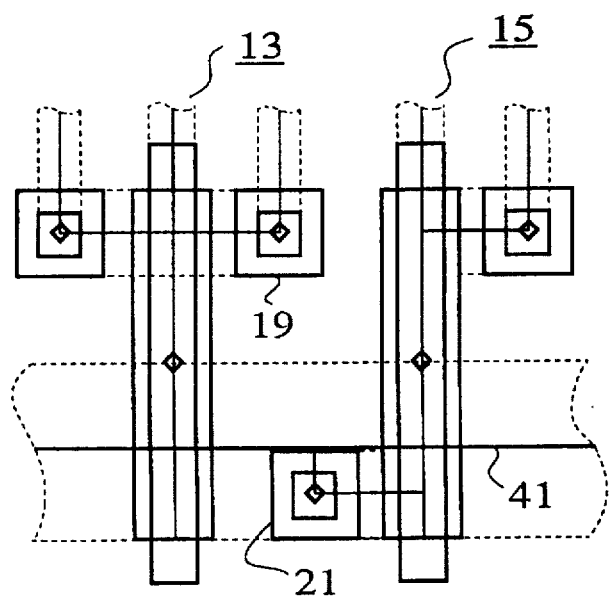
FIG. 16 is a view showing a resultant symbolic layout after the symbolic layout shown in FIG. 15 is compacted in the Y-axis direction.

In the present invention, since the contacts 19, 21 are moved upwardly by the wiring length shortening process (S9 in FIG. 17), the power source line 41 in FIG. 16 is also moved upwardly by the shortening process in the Y-axis direction (S17 in FIG. 17) to be superposed on the transistor. Thus, in contrast to the conventional instance shown in FIG. 9, the size of the symbolic layout is also compacted in the Y-axis direction.

As described above, as the result of the compaction of the dimension, notches which do not satisfy the design rule are sometimes generated. Therefore, finally such notches are removed by a filling process and then the symbols are hierarchically developed (S19 in FIG. 17). As a result, a mask layout 61 in FIG. 17 which is expressed by polygons and fitted to new processes is generated.

Next, a layout apparatus for a semiconductor integrated circuit according to the present invention will be explained.

As the layout apparatus of the present invention, an ordinal computer system may be used. The computer system comprises a CPU for performing various processes, an input device such as a keyboard, a mouse, a write pen, a flexible disk device, an external memory device such as a memory device, a disk device, an output device such as a display device, a printer, and the like. In this case, arithmetic process etc. in the layout generation etc. are performed in an arithmetic section in the CPU.

Figure 10:
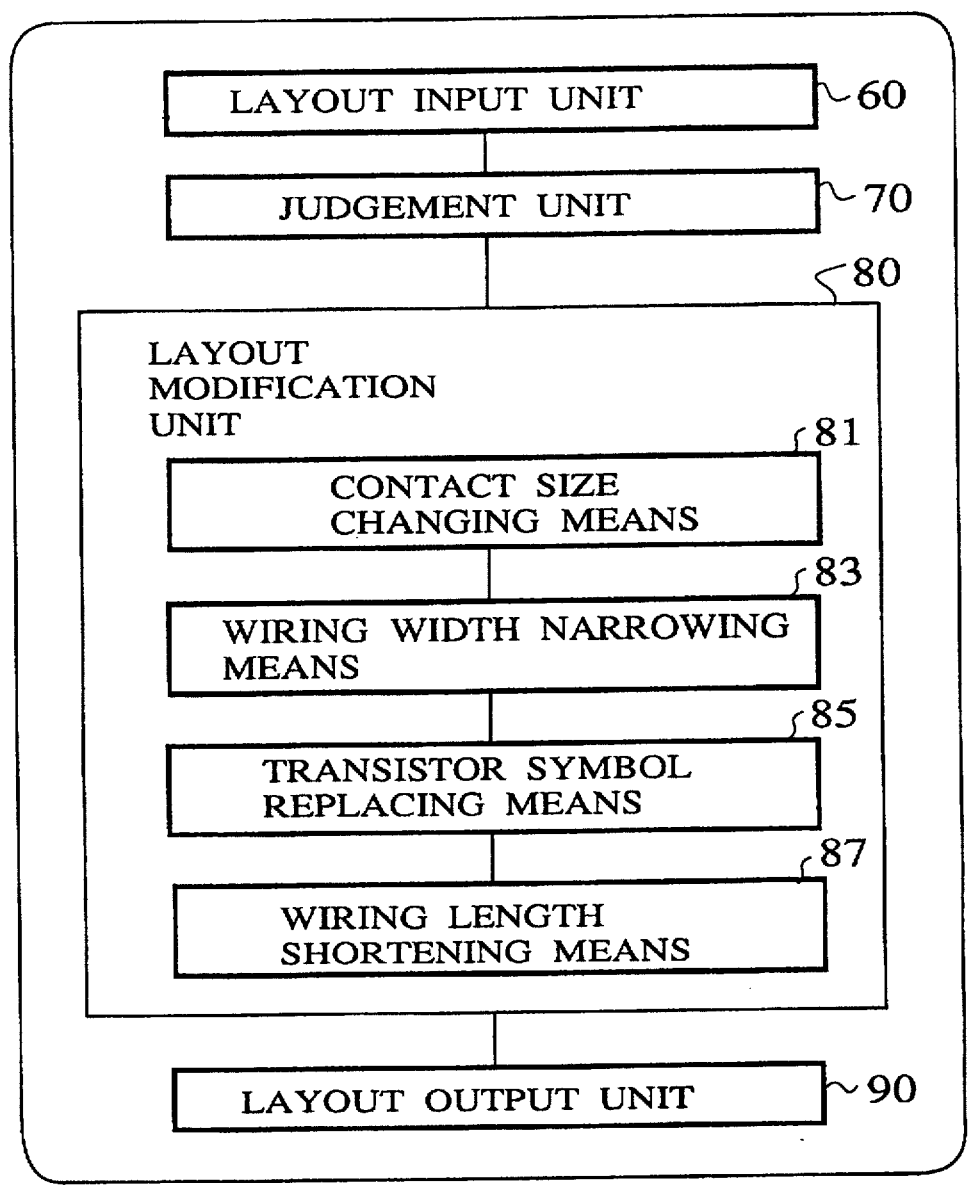
FIG. 10 is a block diagram showing a configuration of a layout apparatus for a semiconductor integrated circuit according to the present invention.

FIG. 10 is a block diagram showing a configuration of a layout apparatus for a semiconductor integrated circuit according to the present invention. Then, process operations of the layout apparatus will be explained with reference to FIG. 10.

First, the existing symbolic layout is input by a layout input unit 60. Here, input operation is conducted by either manually inputting data or reading data stored in the flexible disk device etc. in various storing formats therefrom and then interpreting read data.

Then, it is determined by a judgement unit 70 whether the input symbolic layout should be modified or not. Here, as shown in FIG. 13, it is determined whether the symbolic layout includes two transistor symbols 13, 15 adjacent to each other in the channel length direction (X-axis direction), and two contact symbols 19, 21 arranged between the symbols 13, 15 so as to mutually extend in opposite directions in the channel width direction (Y-axis direction). In addition, if there are a plurality of symbolic layouts, it is also determined whether all symbolic layouts can be modified or not.

Subsequently, in case it is determined by the judgement unit 70 that the symbolic layout can be modified, a layout modification unit 80 performs processes in steps S3 to S19 in FIG. 17.

More particularly, a process in step S3 in FIG. 17 is performed by a contact size changing means 81, a process in step S5 in FIG. 17 is performed by a wiring width narrowing means 83, a process in step S7 in FIG. 17 is performed by a transistor symbol replacing means 85, and processes in steps S9 to S19 in FIG. 17 are performed by a wiring length shortening means 87 for the contact symbol.

Finally, a newly resultant symbolic layout is output by a layout output unit 90 to be stored or to be verified. Particularly, in order to output the resultant symbolic layout to the display device, the printer device, or the external storing device etc., an output format is converted and then the symbolic layout is output.

Hence, in the present embodiment, first the layout can be compacted in the channel length direction of the transistor since the source contacts and the diffusion contacts which are not the source contacts and are located adjacent to the source contacts are arranged alternatively. Then, the layout can also be compacted in the channel width direction since the power source line is superposed on the transistors. Consequently, an area occupied by the semiconductor integrated circuit can also be reduced.

In addition, note that, in case any drawbacks are found in a high speed algorithm for shortening wiring length etc., the transistor symbol in which the diffusion layer terminal 1 does not spread over the entire channel width, as shown in FIG. 12, may be utilized. In this case, the wiring to be connected to the diffusion layer terminal cannot be moved to the upper side of the wiring 9 in FIG. 12. Therefore, even if the wiring length shortening process intends to move the source contact 21 in FIG. 13, for example, upwardly by mistake, the source contact 21 cannot be moved. Alternatively, a small size symbolic layout shown in FIG. 15 can be generated by the compaction in the X-axis direction.

In the above embodiments, in actual manufacturing, the contact includes a silicide layer formed on the surface of the silicon layer by salicide technology. In such case, the advantage of the present invention can be attained extremely remarkably.

A first advantage of the layout method and the layout apparatus for the semiconductor integrated circuit according to the present invention is that, in the case of the process having small diffusion layer resistance like salicide, the layout size can be reduced without degradation in performance. As a result, the production cost can be decreased.

A second advantage of the layout method and the layout apparatus according to the present invention is that, upon compaction process, vast computer resources such as memory capacity, process time are not required. In contrast to the second instance of the conventional symbolic layout, required computer resources become small since the contact terminals and the diffusion terminals in the transistor are formed as the point-like terminal. In addition, if respective symbols used in the present invention are employed, the compaction in the channel length direction is identical to the point-like terminal. For this reason, the computer resources are not needed as much. In the size compaction processes described above, the symbolic layout of the present invention just requires the smallest amount of computer resources. Especially, since a process time required for the compaction process has a complexity more than linearity on a graph scale, the method of the present invention has a time shortening advantage which is greater than a reduction of the number of graph nodes.

With the above, the method of the process migration of the present invention does not include wiring processes at all and thus becomes simple, while maintaining optimum resultant size and optimum computer resources. Therefore, a plenty of labors are not required to embody the present invention. In addition, a process time required for the process migration (steps S3 to S7 in FIG. 17 in a narrow sense) becomes short.

What is claimed is:

1. A layout method for a semiconductor integrated circuit comprising the steps of:
    a) extracting a mask layout to be processed;
    b) changing dimensions of a symbolic layout included in said mask layout;
    c) replacing transistor symbols included in said mask layout with symbols having diffusion layer terminals each having a constant length in a channel width direction and not having extent in a channel length direction;
    d) shortening a length of wiring included in said mask layout in the channel width direction of said transistor symbols;
    e) compacting said mask layout in the channel length direction of said transistor symbols;
    f) shortening a length of wiring included in said mask layout in the channel length direction of said transistor symbols;
    g) compacting said mask layout in the channel width direction of said transistor symbols;
    h) narrowing a length of wiring included in said mask layout in the channel width direction of said transistor symbols; and
    i) removing notches which do not satisfy a design rule by a filling process and developing hierarchically symbols after the step h),
    wherein respective steps are performed in that order.

2. A layout apparatus for a semiconductor integrated circuit for performing process migration wherein a mask layout for said semiconductor integrated circuit obtained based on a first design rule is modified into a mask layout obtained based on a second design rule which is different from said first design rule, comprising:
    a layout input unit for inputting a symbolic layout;
    a layout modification unit for modifying said symbolic layout input by said layout input unit;
    a layout output unit for outputting said symbolic layout modified by said layout modification unit;
    wherein said layout modification unit includes:
        contact size changing means for changing a contact size of contact symbols;
        wiring width narrowing means for narrowing a wiring width of diffusion layers;
        transistor symbol replacing means for replacing transistor symbols having point-like diffusion layer terminals with transistor symbols having diffusion layer terminals having constant lengths in the channel width direction and not having extent in a channel length direction; and
        wiring length shortening means for moving said contact symbols so as to shorten said wiring length, wherein said layout apparatus changes relative location of said contact symbols to said transistor symbols along two directions.

3. A layout apparatus according to claim 2, further comprising a judgement unit for determining whether said layout is to be modified by said input symbolic layout or not, and said layout modification unit modifies said symbolic layout if said judgement unit determines that said layout should be modified.

4. A layout apparatus according to claim 3, wherein said judgement unit determines that said layout should be modified if said symbolic layout has two transistor symbols positioned adjacent to each other in the channel length direction, two contact symbols arranged between said two transistor symbols, and wiring symbols extending therefrom in the opposite direction.

5. A layout method for designing a semiconductor integrated circuit comprising the steps of:
    (a) providing a symbolic layout which expresses a configuration of said semiconductor integrated circuit by symbols, said symbols including,
        (i) transistor symbols having diffusion layer terminals which have constant lengths in a channel width direction,
        (ii) contact symbols each having a diffusion layer terminal,
        (iii) diffusion layer wirings for connecting said diffusion layer terminals of said transistor symbols to said diffusion layer terminals of said contact symbols by a straight line, and
        (iv) symbols representing metal wirings for connecting said contact symbols;
    (b) shortening widths of said diffusion layer wirings in agreement with dimensions of said contact symbols;
    (c) shortening lengths of said diffusion layer wirings in the channel width direction of said transistor symbols; and
    (d) compacting said symbolic layer in a channel length direction of said transistor symbols,
    wherein the steps (b), (c), and (d) are performed in that order or in the order of step (c), step (b), and then step (d), and
    wherein relative locations of the contact symbols to the transistor symbols are changed along two directions.

6. The layout method as claimed in claim 5, further comprising the following steps carried out before step (b):
    (e) extracting a symbolic layout from a mask layout to be processed;
    (f) replacing transistors included in said mask layout with said transistor symbols,
    wherein the steps (e) and (f) are performed in that order.

7. A layout method according to claim 6, further comprising the step g) of shortening a length of wiring included in said mask layout in the channel length direction of said transistor symbols after said step d).

8. A layout method according to claim 7, further comprising the step h) of compacting said mask layout in the channel width direction of said transistor symbols after said step g).

9. A layout method according to claim 8, further comprising the step i) of narrowing a length of wiring included in said mask layout in the channel width direction of said transistor symbols after said step h).

10. The layout method as claimed in claim 5, wherein each of said transistor symbols does not have a width in the channel length direction and wherein each of said contact symbols has a point-like terminal.

11. The layout method as claimed in claim 5, wherein said two directions include the channel width direction and the channel length direction.

* * * * *